United States Patent [19]

Kawakami et al.

[11] 4,080,538
[45] Mar. 21, 1978

[54] METHOD OF CONTROLLING SWITCHING OF PNPN SEMICONDUCTOR SWITCHING DEVICE

[75] Inventors: Akira Kawakami; Hiroshi Gamo; Yahei Takase, all of Itami, Japan

[73] Assignee: Mitsubishi Denki Kabushiki Kaisha, Tokyo, Japan

[21] Appl. No.: 698,604

[22] Filed: Jun. 22, 1976

Related U.S. Application Data

[63] Continuation-in-part of Ser. No. 535,026, Dec. 20, 1974, abandoned.

[51] Int. Cl.² ............................................. H03K 17/72
[52] U.S. Cl. .............................. 307/252 J; 307/252 N; 307/305
[58] Field of Search ............. 307/25 ZB, 25 N, 25 Q, 307/25 W, 25 J, 305; 323/22 SC

[56] References Cited

U.S. PATENT DOCUMENTS

| | | | |
|---|---|---|---|
| 3,404,293 | 10/1968 | Harris et al. | 307/252 J |
| 3,488,522 | 1/1970 | Cameron et al. | 307/305 X |
| 3,622,806 | 11/1971 | Williams | 307/252 N |

Primary Examiner—John Zazworsky
Attorney, Agent, or Firm—Wenderoth, Lind & Ponack

[57] ABSTRACT

After a principal current through an SCR has been decreased to zero by inverting the polarity of the voltage between the main terminals of the SCR(anode voltage,) its gate is reversely biased with a gate bias pulse including a time point where the anode voltage passes through a zero point toward the positive direction. Also, the gate is reversely biased with a gate bias signal in the form of a direct current less in amplitude than the bias pulse. The bias signal may be in the form of a pulse consecutive to the bias pulse and terminating not earlier than the termination of the OFF-state voltage.

4 Claims, 15 Drawing Figures

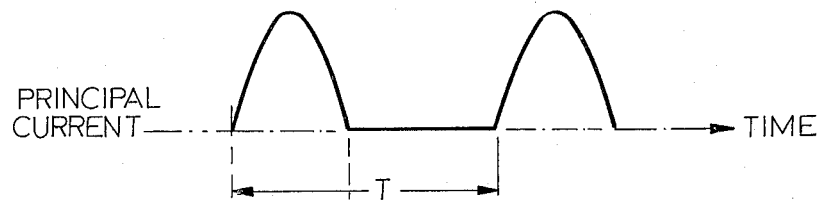
FIG. 2a PRINCIPAL CURRENT
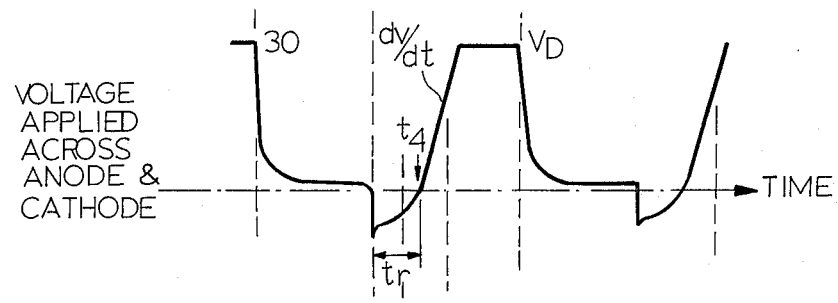
FIG. 2b VOLTAGE APPLIED ACROSS ANODE & CATHODE
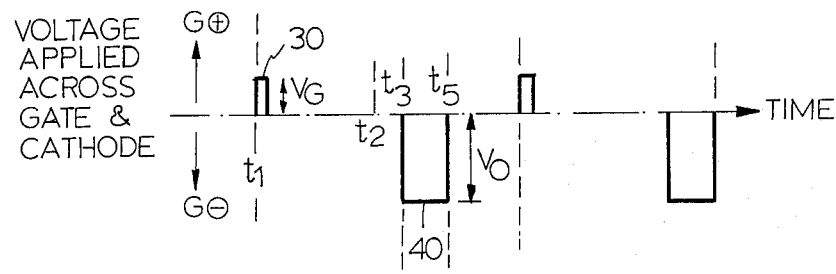
FIG. 2c VOLTAGE APPLIED ACROSS GATE & CATHODE
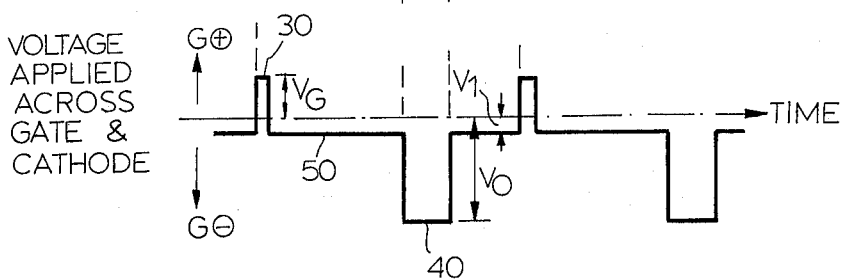
FIG. 2d VOLTAGE APPLIED ACROSS GATE & CATHODE

METHOD OF CONTROLLING SWITCHING OF PNPN SEMICONDUCTOR SWITCHING DEVICE

This application is a continuation-in-part of application Ser. No. 535,026 filed Dec. 20, 1974, now abandoned.

BACKGROUND OF THE INVENTION

This invention relates to a method of controlling the switching of a semiconductor switching device, including at least one PNPN junction so as to reduce the turn-off time thereof and also to increase both the OFF-state voltage and a dv/dt capability.

A description will now be given, by way of example, of the switching of silicon controlled rectifiers (SCR's) most typical among PNPN semiconductor switching devices.

In order to switch an SCR from its ON state to its OFF state, the usual practice is to forcedly reverse the voltage across the main electrodes or the anode and cathode electrodes thereof by means of an external circuit and maintain the resulting reversely biased state for a predetermined time interval. The minimum time interval between the instant when the principal current has decreased to zero and the instant when the SCR is capable of supporting a reapplied positive anode voltage without turning on is called the turn-off time. In SCR's, the turn-off time can be variously changed in accordance with the operating conditions such as the waveforms of current and voltage, and the temperature imparted to the SCR's. Among them it is to be noted that if a signal is applied across the gate and cathode electrodes of SCR's, their turn-off time changes. This signal is called a "reverse gate bias pulse" hereinafter.

There is a well-known phenomenon that when a reverse gate pulse is applied across the gate and cathode electrodes of SCR's having the main electrodes reversely biased with respect to each other, the turn-off time thereof is decreased. The mechanism by which this phenomenon occurs should readily be understood from the construction of SCR's and need not be described in detail herein.

There has been often demanded for various applications SCR's having shorter turn-off times and yet which are still able to control high voltage and large currents. To this end, it has usually been the practice to dope the silicon substrate of the SCR's with a heavy metal such as gold acting as a lifetime killer, thereby to reduce the turn-off time. However, this measure has been attended with the undesirable phenomenon that the shorter the turn-off time, the more the other important characteristics, such as the ON-state voltage, OFF-state voltage, etc. will deteriorate. Therefore, SCR's for switching high electric voltages and large currents at high speeds have had an upper limit beyond which their performance cannot be improved. Under these circumstances, it is quite proper to introduce the effect of reversely biasing the gate.

It will be found that, upon the application of the reverse gate bias pulse to high power, high speed SCR's, the turn-over time is not decreased very much. This is mainly attributable to the shorted emitter structure. In order to decrease the turn-off time, the shorted emitter structure may be removed from the SCR's. However, if the shorted emitter structure is removed from the cathode region of SCR's having a relatively large area, such as in high power SCR's, then the injection efficiency at the associated junction is greatly decreased to greatly lower the dv/dt capability, where dv/dt is a rate of rise of the OFF-state voltage. Thus, upon applying the forward voltage across such SCR's, the resulting multiplied current is increased, resulting in a decrease in OFF-state voltage and the like.

SUMMARY OF THE INVENTION

Accordingly, it is an object of the present invention to provide a new and improved method of controlling the switching of PNPN semiconductor switching devices, whereby the turn-off time is shorter and the forward OFF-state voltage and the dv/dt capability become higher than those provided by conventional control methods.

The present invention accomplishes this object by the provision of a method of controlling the switching of a PNPN semiconductor switching device including an anode electrode, a cathode electrode and a gate electrode comprising the application of a first gate bias across the gate electrode and the cathode electrode. The first gate bias and the second gate bias have an opposite polarity from a gate trigger signal, and the first gate bias across the gate electrode and the cathode electrode includes a time point where the voltage across the PNPN semiconductor switching device inverted in a reverse direction after the interruption of a principal current flowing through the switching device is again inverted in a forward direction.

Advantageously, the second gate bias may be retained at least during a time interval for which off-state voltage is applied across the PNPN semiconductor switching device.

Conventionally, the first gate bias may be consecutive to the second gate bias.

One feature of the present invention is to define the phase relationship between the first and second gate biases as above-described, and also between the principal current and voltage waveforms for PNPN semiconductor switching devices in order to control the switching thereof in the manner as above-described.

BRIEF DESCRIPTION OF THE DRAWINGS

The present invention will become more readily apparent from the following detailed description taken in conjunction with the accompanying drawings, in which:

FIGS. 2a–2d are graphs illustrating the waveforms of voltage and current used in the control method according to the principles of the present invention and a prior art type control method;

DESCRIPTION OF THE PREFERRED EMBODIMENTS

Figure 1A:
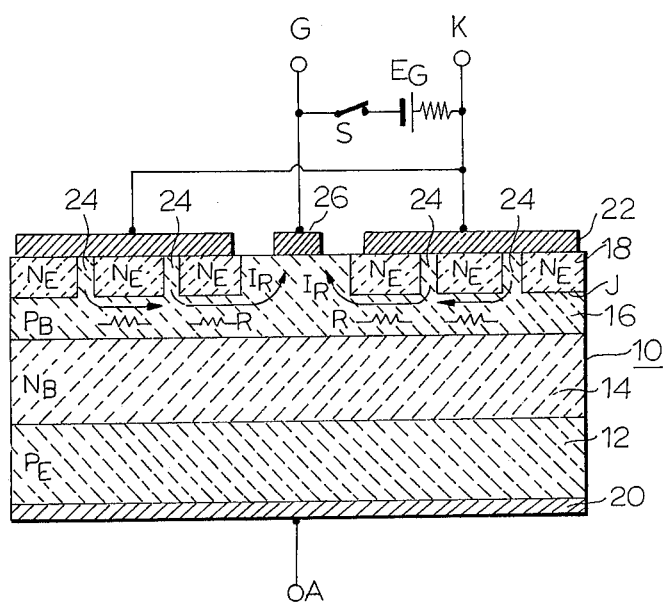
FIG. 1a is a sectional view of a conventional SCR useful in explaining the operation thereof with a reverse voltage applied across the gate and cathode electrodes thereof.

Referring now to the drawings and FIG. 1a in particular, there is illustrated a shorted emitter type SCR of a conventional construction. The SCR is generally designated by the reference numeral 10 and comprises an anode emitter layer 12, an anode base layer 14, a cathode base layer 16 and a cathode emitter layer 18 alternating in polarity with respect to one another and superposed on one another to form PN junctions therebetween to provide a PNPN four layer structure. The PN junction formed between the cathode base and emitter layers 16 and 18, respectively, is labeled "J", and the cathode emitter layer 18 is divided into a plurality, in this case three, of portions.

An anode electrode 20 is disposed in ohmic contact with the anode emitter layer 12, and a cathode electrode 22 is disposed in ohmic contact with the portions of the cathode emitter layer 18 to shortcircuit the separate portions of the latter. Thus shorted emitter regions 24 are formed between the separate portions of the cathode emitter layer 18. Further, a gate electrode 26 is disposed in ohmic contact with the cathode base layer 16 and is connected to the cathode electrode 22 through a series circuit of a normally open switch means S, a bias source of direct current $E_G$ and a resistor. The anode, cathode and gate electrodes 20, 22 and 26, respectively, are connected to an anode, a cathode and a gate terminal A, K and G, respectively.

As seen in FIG. 1a, the bias source $E_G$ is adapted to apply to the gate electrode 26 a bias pulse rendering the latter negative with respect to the cathode electrode 22. Namely, the bias pulse from the source $E_G$ is opposite in polarity from a gate trigger pulse for the SCR 10 and forms a reverse gate bias pulse as above described. The purpose of applying the reverse gate bias pulse to the gate electrode 26 is to maintain the junction J in its reversely biased state to prevent minority carriers from the cathode emitter layer 18 from being injected into the cathode base layer 16 upon a change of the polarity of the voltage across the anode and cathode terminals A and K, respectively, in a forward direction. Therefore, it is required to bias the junction J sufficiently over its entire region in a reverse direction for suppressing any undesirable firing of the SCR. If any portion of the junction J is not sufficiently biased in the reverse direction, then the particular turn-off fails on that portion of the junction J resulting in a decrease in the effect of reverse bias.

More specifically, with the arrangement of FIG. 1a in its blocking state in which a flow of principal current therethrough is interrupted, the closure of the switch S causes the source $E_G$ to apply a reverse voltage across the gate and cathode electrodes 22 and 26, respectively. This results in a flow of current $I_R$ (see FIG. 1a) through the shorted emitter regions 24. Since the cathode base layer 16 has a lateral resistance R as determined by the sheet resistance exhibited by the same, the resistance is presented to the current $I_R$ to cause a lateral voltage drop of $R \times I_R$ thereacross, acting to oppose the reverse gate bias voltage as above described. As a result, the effect of reverse bias is decreased, as above described.

It will readily be understood that, in order to eliminate the shortcoming as above described, all the shorted emitter regions, serving to carry the lateral current $I_R$ should be omitted. This will lead to a satisfactory result as far as a decrease in the turn-off time is concerned.

However, if the shorted emitter portions are removed from the cathode portion having a large area such as in high power SCR's, then the injection efficiency at the junction J is materially increased to a very high value with the result that the $dv/dt$ capability decreases substantially and the multiplied current increases upon applying the forward voltage across SCR's. Consequently, the undesirable results such as a decrease in the OFF-state voltage is caused during practical use.

The present invention contemplates switching PNPN semiconductor switching devices having no shorted emitter portions with a decreased turn-off time, and also maintaining both the forward OFF-state voltage and the $dv/dt$ capability at a high level. The invention will now be described with reference to FIGS. 1b – 6b, while comparing it with the prior art practice.

Figure 1B:
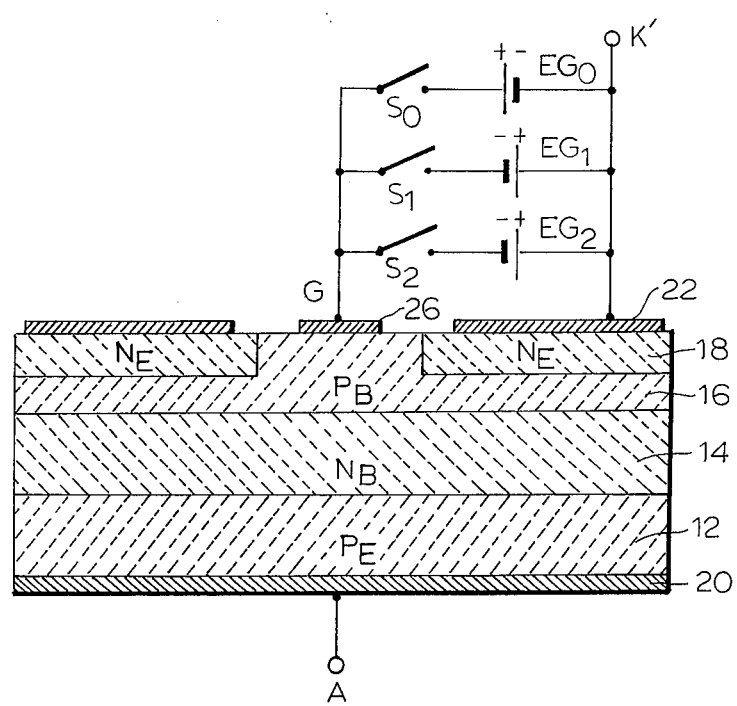
FIG. 1b is a view similar to FIG. 1a showing an SCR having circuit means coupled thereto for carrying out the method of the present invention.

It is now assumed that a high power SCR including a cathode portion having a relatively large area and having no shorted emitter portion, as shown in FIG. 1b, is subjected to a turn-off time test such as described in Standards of Electronic Industries Association of Japan, SD-31, Testing Methods for Thyristors, established Nov. 29, 1966, section 4.8, pages 12 and 13, which produces the waveforms as shown in FIGS. 2a and 2b, respectively. A gate trigger pulse 30 with amplitude $V_G$, as shown in FIG. 2c, is applied to the SCR through schematically shown switching means $S_O$ from voltage source $E_{GO}$, and the principal current is initiated so as to flow through the SCR at time point $t_1$ while at the same time the voltage across the anode and cathode electrodes of the SCR suddenly decreases to a very low magnitude as shown in FIGS. 2a and 2b. The voltage is maintained at the very low magnitude until it goes negative at time point $t_2$ when the principal current terminates. Immediately thereafter the voltage goes to zero and passes through the zero point at time point $t_4$ and changes to the forward direction. Then the voltage is increased to a predetermined fixed magnitude of $V_D$ and is maintained at that magnitude until it again suddenly decreases at the end of the time period T. At that time, the next principal current is initiated so as to flow through the SCR, resulting in a repetition of the process as above described.

In the conventional control method, a reverse gate bias pulse 40 with an amplitude of $-V_o$ is applied across the gate and cathode electrodes of the SCR by source $E_{G1}$ and switch $S_1$ at time point $t_3$ after the interruption of the principal current as shown in FIG. 2c. The reverse gate bias pulse 40 having the opposite polarity from the gate trigger pulse 30 terminates at time point $t_5$ and serves to decrease the turn-off time. The application of both pulses 30 and 40 is repeated for each period T.

In order to decrease the turn-off time through the application of a reverse gate bias pulse effectively without the withstanding voltage and $dv/dt$ capability being decreased, the conditions for applying the reverse gate bias pulse have been variously studied. As a result, it has been found that using a waveform according to one embodiment of the present invention as shown in FIG. 2d gives a very excellent result. A description will not be given of the waveform as shown in FIG. 2d and what has led to the method of the present invention with reference to FIGS. 3a, 3b, 4 and 5.

FIG. 2d shows the waveform according to the control method of one embodiment of the present invention which is different from that of FIG. 2c only in that a gate bias signal 50 in the form of a direct current having a magnitude or an amplitude of $-V_1$ is provided by source $E_{G2}$ and switch $S_2$, as shown in FIG. 1b. That is, the gate bias signal 50 is identical in polarity to the gate bias pulse 40. It is noted that the gate bias signal 50 is less in absolute magnitude of amplitude than the gate bias pulse 40. From FIGS. 2b, 2c and 2d it is seen that the reverse gate bias pulse 40 includes a time point $t_4$ where the anode voltage across the SCR 10 passes through a zero point in the forward direction.

It is noted that the first gate bias Vo is applied during the time $t_4$, while the second gate bias $V_1$ is applied during the time including the time for which the voltage across the anode and cathode electrodes is of a positive polarity and other than the time of application of the gate bias Vo.

Moreover, it is to be noted that a pulse due to the closure of the switch means in each voltage source circuit of FIG. 1b should be prevented from flowing, as a reverse current, into any of the remaining voltage source circuits. A practical circuit configuration for carrying out the application of the various bias voltages in the desired manner is shown in FIG. 1c.

Figure 1C:
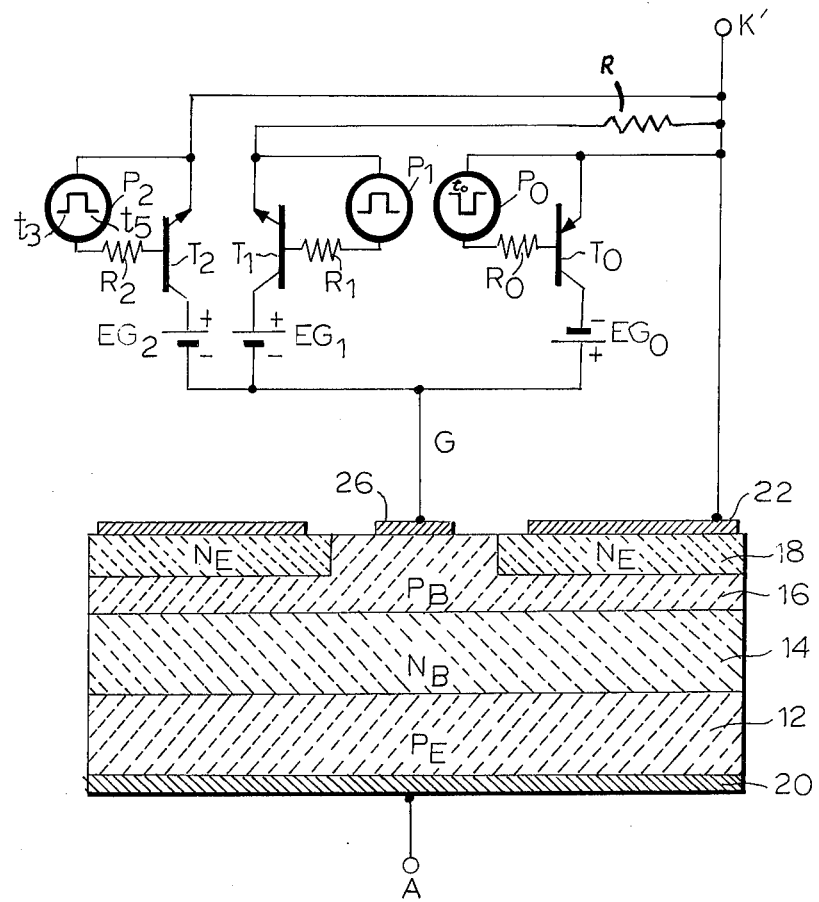
FIG. 1c is a view similar to FIG. 1b showing a detailed circuit means.

In FIG. 1c, the DC sources (which may be batteries) designated by $E_{G_0}$, $E_{G_1}$ and $E_{G_2}$, as shown in FIG. 1b, respectively, and transistors $T_0$, $T_1$ and $T_2$ shown in FIG. 1c, represents the switch means $S_0$, $S_1$ and $S_2$ as illustrated in FIG. 1b, respectively.

As shown in FIG. 1c, a pulse oscillator generator $P_o$ is connected across the base and emitter electrodes of the transistor $T_o$ through a resistor $R_o$ to apply a base current pulse to the base electrode for switching the transistor $T_o$ and a pulse generator $P_1$ is connected across the base and emitter electrodes of the transistor $T_1$ through a resistor $R_1$ to apply a base current pulse to the base electrode for switching the transistor $T_1$. Similarly, a pulse generator $P_2$ is operatively connected to the transistor $T_2$ for switching the latter.

The pulses supplied from the pulse generators $P_o$, $P_1$ and $P_2$ have a phase relationship for switching the bias voltages according to the waveform of FIG. 2d. The pulses from the pulse generators $P_0$, $P_1$ and $P_2$ are designated by $P_0'$, $P_1'$ and $P_2'$, respectively. The pulse $P_0'$ rises at time point $t_1$ and has a pulse width identical to the pulse 30 shown in FIG. 2d of the present specification. The pulse $P_2'$ rises at time point $t_3$ and terminates at time point $t_5$. Considering FIG. 6c of the present specification, the pulse $P_1'$ rises at time point $t_5$ and terminates at time point $t_7$. It is noted that the pulse $P_1'$ has variable starting and terminating time points and pulse widths. Also, the pulse $P_1$ must be identical in both phase and pulse width to the pulse 50 having a height $V_1$ as shown in FIG. 2d.

It will readily be understood that the phase relationship between these pulses, that is, the starting and terminating time points thereof, can be set in a manner well-known in the art. The circuity for setting those time points does not form a part of the present invention, and therefore is not described in detail.

In FIG. 1c the resistors $R_0$, $R_1$ and $R_2$ serve to limit base currents to the associated transistors $T_0$, $T_1$ and $T_2$, respectively.

Among the electric characteristics, the turn-off time $t_g$, the $dv/dt$ capability and the breakover voltage $V_{BO}$ are of the most importance and these characteristics resulting from the waveforms as shown in FIGS. 2c and 2d are illustrated in FIGS. 3a, 3b, 4 and 5.

Figure 3A:
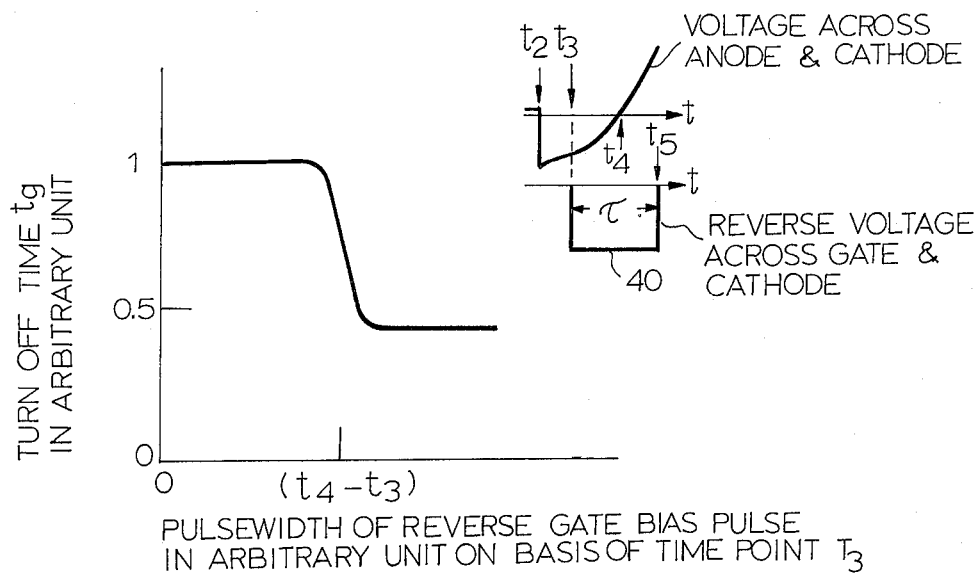
FIGS. 3a, 3b, 4 and 5 are graphs of the electric characteristics achieved by an embodiment of the present invention and a prior art type control method for comparison purposes.

FIG. 3a shows the turn-off time $t_g$ in arbitrary units plotted on the ordinate against the duration or pulsewidth $\tau$ of the reverse gate bias pulse 40 on the abscissa. This pulsewidth is expressed in arbitrary units on the basis of the time point $t_3$ at which the reverse gate bias pulse 40 is initiated and applied across the gate and cathode electrodes of the SCR as shown on an enlarged scale on the righthand portion in FIG. 3a. From FIG. 3a it is also seen that, when the time point $t_4$ where the voltage across the anode and cathode electrodes is changed from the reverse direction to the forward direction is within the pulsewidth of the reverse gate bias pulse 40 as above described that the turn-off time $t_g$ is abruptly decreased.

Figure 3B:
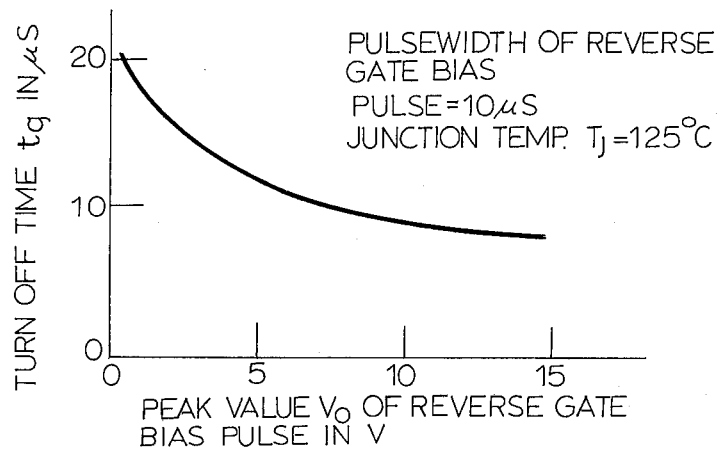

FIG. 3b shows the turn-off time $t_g$ in microseconds plotted on the ordinate against the amplitude $V_o$ in volts of the reverse gate bias pulse 40 on the abscissa with the pulse 40 having a pulsewidth of 10 microseconds and with an SCR having a junction temperature $T_j$ maintained at 125° C. From FIG. 3b it is seen that the reduction of the turn-off time $t_g$ levels off to a certain magnitude after the amplitude $V_o$ has reached about 10 volts. Thus, it will be understood that the use of the reverse gate bias pulse having a voltage of at most 10 volts is sufficient for practical purposes. The methods as depicted in FIGS. 2c and 2d have given substantially similar results such as shown in FIGS. 3a and 3b.

It has been found that the turn-off time can be sufficiently decreased by causing the pulsewidth of the reverse gate bias pulse 40 to be equal to or more than a fifth of a time interval for which the anode electrode of the SCR is reversely biased with respect to the cathode electrode thereof.

Figure 4:
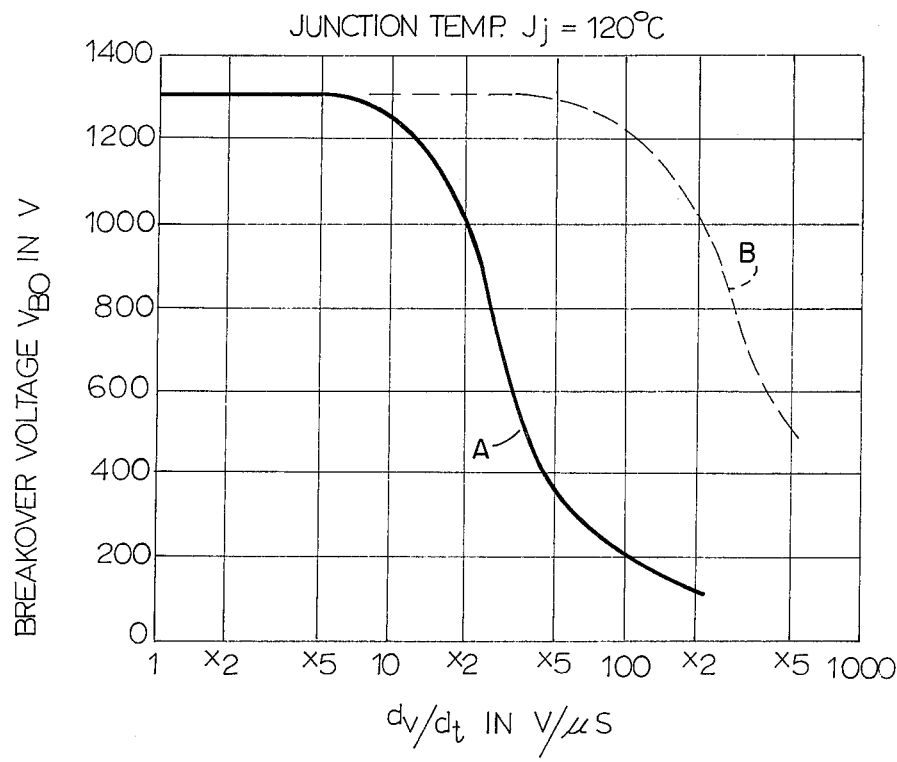

FIG. 4 shows a breakover voltage $V_{BO}$ in volts plotted on the ordinate against $dv/dt$ in volts per microsecond. In FIG. 4, the solid curve labeled A shows the result of the use of the waveform as illustrated in FIG. 2c, while the dotted curve labeled B shows the result due to the use of the waveform as illustrated in FIG. 2d. From FIG. 4 it is seen that the $dv/dt$ capability resulting from the present invention is superior to that resulting from the prior art practice and indeed is improved by one order of magnitude or more as compared with the latter.

Figure 5:
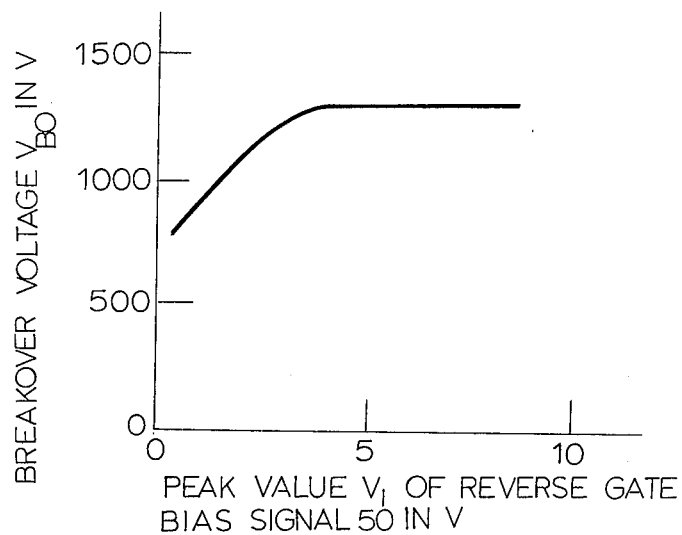

FIG. 5 shows the relationship between a breakover voltage $V_{BO}$ in volts (on the ordinate) and the amplitude $V_1$ of the reverse gate bias signal 50 in volts (on the abscissa) obtained with the waveform as illustrated in FIG. 2d. The results of experiments as shown in FIG. 5 indicate that the breakover voltage $V_{BO}$ is rapidly increased with an increase in the amplitude $V_1$ of the signal 50 until it reaches a saturated value with the amplitude $V_1$ ranging from 3 to 4 volts. It has been found that the present invention produces much improved breakover voltage characteristics as compared with the prior art practice.

It is not particularly difficult to apply a reverse gate bias signal having a voltage of at most 3 or 4 volts across the gate and cathode electrodes of SCR's by properly designing and manufacturing the control circuits therefor. Thus, the present invention is very easily utilizable.

The present invention has been described in conjunction with the reverse gate bias signal in the form of a direct current, that is, with an infinite pulsewidth. This is because the application of the reverse gate bais $V_1$ in the form of a direct current is the simplest means from the standpoint of the circuit design. In this case, the npn transistor $T_1$ is able to be taken away, and the DC source $E_{G1}$ is connected across the gate and the cathode electrodes of the SCR's through a resistor R, which serves to limit a current entrancing into this source circuit in a time period when $T_o$ or $T_2$ switches on. The purpose of applying the reverse bias $V_1$ naturally is to improve both the $dv/dt$ capability and the breakover voltage $V_{BO}$, and therefore it is not required to apply the $V_1$ to SCR's in a time period ($t_2-t_1$) in which the SCR's are in their conducting state.

FIG. 6 shows two different modifications of the present invention. FIGS. 6a and 6b are similar to FIGS. 2a and 2b, respectively. Namely, FIG. 6a illustrates the current through a SCR and FIG. 6b illustrates the voltage across a SCR during a turn-off time test such as described in Standards of Electronic Industries Association of Japan SD-21, Testing Methods for Thyristors, established Nov. 29, 1966, section 4.8, pages 12 and 13 in the manner as above described in conjunction with FIGS. 2a and 2b.

Figure 6A:
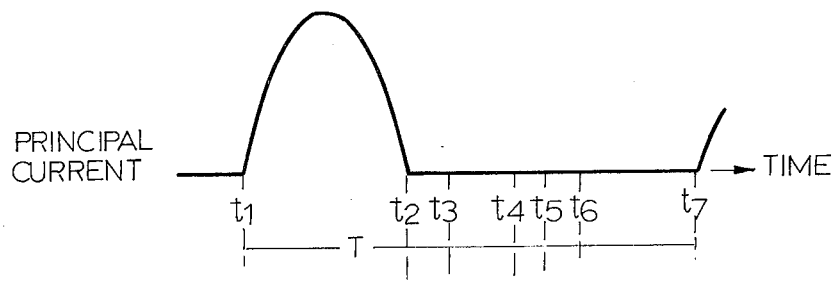
FIGS. 6a–6c are graphs illustrating waveforms of voltage and current used with other embodiments of the present invention.
Figure 6B:
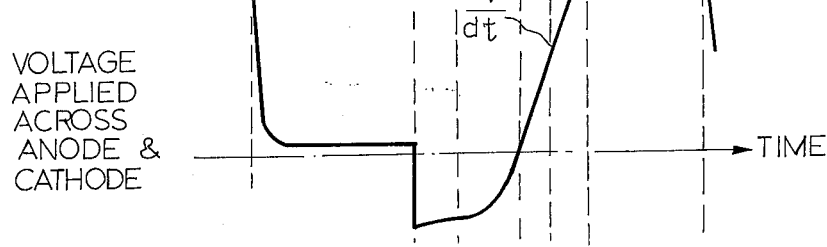
Figure 6C:
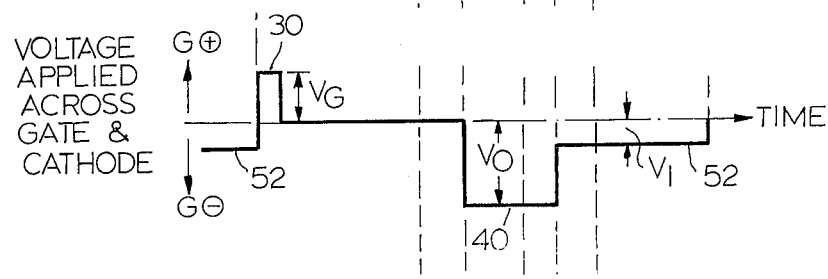
Figure 6D:
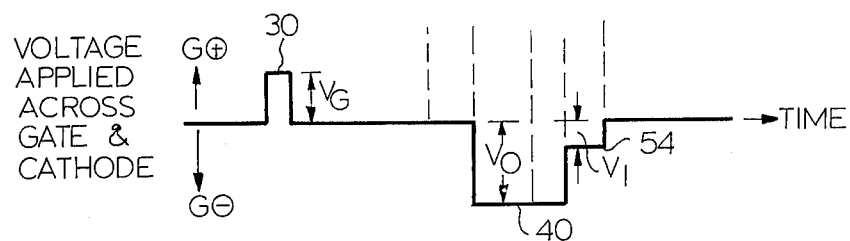

The waveform as shown in FIG. 6c is characterized in that the reverse gate bias 52 with an amplitude of $-V_1$ is applied across the gate and cathode electrode of the SCR only during a time interval for which an OFF-state voltage is applied across the SCR. That is, the reverse bias 52 is applied across the gate and cathode electrodes of the SCR in a time period from time point $t_5$ where the reverse gate bias pulse 40 terminates, to time point $t_7$ where the period T terminates. Namely the pulse 52 is consecutive to the pulse 40.

The operation of the arrangement as shown in FIG. 1c will now be described in conjunction with FIGS. 6a, 6b and 6c of the present specification because the description in conjunction with FIGS. 6a, 6b and 6c will be the most readily understood. It is to be noted that the arrangement of FIG. 1c can also be used to produce the waveforms of FIGS. 2a, 2b and 2d.

At time point $t_1$, the pulse $P_o'$ is supplied to the transistor $T_o$ to turn it on to permit the voltage $E_{Go}$ to be applied across the gate G and cathode K of the SCR, with the gate G being positive with respect to the cathode K. The pulse $P_o'$ corresponds to the pulse 30 having amplitude $V_G$ shown in FIG. 6c. It is noted that during the conductive period of the transistor $T_o$, the transistors $T_1$ and $T_2$ are maintained in their OFF state to prevent a reverse current from the source $E_{Go}$ from flowing into circuits having the transistors $T_1$ and $T_2$ therein.

After the turning-on of the SCR, the principal current flows therethrough from the anode A to the cathode K for a time interval from $t_1$ and $t_2$ as shown in FIG. 6a. A corresponding voltage across the anode A and the cathode K of the SCR is shown by the waveform portion between time points $t_1$ and $t_2$ in FIG. 6b.

At time point $t_3$ the pulse $P_2'$ is applied to the transistor $T_2$ to turn it on. This results in the application of the voltage $E_{G2}$ across the gate G and the cathode K of the SCR with the gate G negative with respect to the cathode K. Then the pulse $P_2'$ terminates at time point $t_5$ to turn the transistor $T_2$ off, thereby to prevent the voltage $E_{G2}$ from being applied across the gate G and the cathode K of the SCR. Thus, the pulse $P_2'$ corresponds to the pulse 40 as shown in FIG. 6c.

From the foregoing it is seen that during the conduction of the transistor $T_2$, the transistors $T_o$ and $T_1$ are in their OFF state, whereby a reverse current from the source $E_{G2}$ is prevented from flowing into circuits having the transistors $T_o$ and $T_1$ therein.

At time point $t_5$, the application of the pulse $P_1$ to the transistor $T_1$ causes the turning-on of the transistor $T_1$. This causes the voltage $E_{G1}$ to be applied across the gate G and the cathode K of the SCR with the gate G negative with respect to the cathode K. At time point $t_7$, the pulse $P_1'$ terminates to turn the transistor $T_1$ off. Therefore, the SCR has no voltage from the source $E_{G1}$ applied across the gate G and the cathode K thereof. Thus, pulse $P_1'$ corresponds to the pulse 52 shown in FIG. 6c. It is seen that, with the transistor $T_1$ in its ON state, the transistors $T_o$ and $T_2$ are maintained in their OFF state to prevent a reverse current from the source $E_{G1}$ from flowing into circuits having the transistors $T_o$ and $T_2$ therein.

In other respects, the waveform as shown in FIG. 6c is similar to the waveform as illustrated in FIG. 2d. The use of the waveform as shown in FIG. 6c produces identical results to those produced by the use of the waveform as shown in FIG. 2d. As in FIG. 2d, it is not particularly difficult to use the reverse gate bias waveform 52.

While the present invention has been illustrated and described in conjunction with a few preferred embodiments thereof, it is to be understood that numerous changes and modifications may be resorted to without departing from the spirit and scope of the present invention. For example, the present invention is equally applicable to reverse conducting thyristors or triac's (trademark), gate turn-off thyristors, etc.

What is claimed is:

1. A method of controlling the switching of a PNPN semiconductor switching device having an interruptible principal current flowing therethrough including an anode electrode to which a pulsed positive anode voltage is applied, a cathode electrode and a gate electrode to which a gate trigger signal is applied, comprising applying a first gate bias across said gate electrode and said cathode electrode, said first gate bias being opposite in polarity from the polarity of the gate trigger signal and being applied during the time point where the voltage across the anode electrode and cathode electrode in the reverse direction is passing through the neutral point, changing from negative to positive after an interruption of the principal current flowing through said PNPN semiconductor switching device, and applying a second gate bias across said gate electrode and said cathode electrode, said second gate bias having the same polarity as said first gate bias, being less in absolute magnitude of amplitude than said first gate bias, and being applied at least during the time from the time said first bias is ended and for a time until the PNPN semiconductor switching device is capable of withstanding the applied positive anode voltage.

2. A method of controlling the switching of a PNPN semiconductor switching device as claimed in claim 1 wherein said second gate bias is in the form of a direct current.

3. A method of controlling the switching of a PNPN semiconductor switching device as claimed in claim 1 wherein said second gate bias is applied during a time interval in which said principal current is interrupted.

4. A method of controlling the switching of a PNPN semiconductor switching device as claimed in claim 1 wherein said second gate bias is consecutive to said first gate bias.

* * * * *